US011032917B2

(12) United States Patent
Lin et al.

(10) Patent No.: US 11,032,917 B2
(45) Date of Patent: *Jun. 8, 2021

(54) CIRCUIT CARRIER BOARD AND MANUFACTURING METHOD THEREOF

(71) Applicant: Unimicron Technology Corp., Taoyuan (TW)

(72) Inventors: Wei-Ti Lin, Hsinchu County (TW); Chun-Hsien Chien, New Taipei (TW); Fu-Yang Chen, Miaoli County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/503,500

(22) Filed: Jul. 4, 2019

(65) Prior Publication Data
US 2019/0380211 A1 Dec. 12, 2019

Related U.S. Application Data

(63) Continuation-in-part of application No. 16/244,113, filed on Jan. 10, 2019, now Pat. No. 10,888,001.
(Continued)

(30) Foreign Application Priority Data

Oct. 18, 2018 (TW) .................................. 107136704
May 7, 2019 (TW) .................................. 108115660

(51) Int. Cl.
*H05K 7/10* (2006.01)
*H05K 3/46* (2006.01)
(Continued)

(52) U.S. Cl.
CPC .......... *H05K 3/4682* (2013.01); *H05K 1/113* (2013.01); *H05K 3/0097* (2013.01);
(Continued)

(58) Field of Classification Search
USPC ........................................................ 361/767
See application file for complete search history.

(56) References Cited

U.S. PATENT DOCUMENTS 8,916,987 B2    12/2014  Schultz et al.
9,307,641 B2     4/2016  Oi et al.
(Continued)

FOREIGN PATENT DOCUMENTS

TW       I599008        9/2017
TW      201844065     12/2018

OTHER PUBLICATIONS

"Office Action of Taiwan Counterpart Application", dated Mar. 9, 2020, p. 1-p. 5.
(Continued)

*Primary Examiner* — Andargie M Aychillhum
(74) *Attorney, Agent, or Firm* — JCIPRNET

(57) ABSTRACT

A circuit carrier board includes a first substrate and a second substrate bonding to the first substrate. The first substrate includes a first circuit layer connecting to a plurality of conductive structure. The conductive structures connect to electronic elements. The second substrate contacts the first circuit layer. The second substrate includes a plurality of stacked dielectric layers, and a plurality of second circuit layers are disposed in the dielectric layers. The bottommost layer of the second circuit layers is exposed outside of the dielectric layers, and the topmost layer of the second circuit layers is electrically connected to the first circuit layer. The conductive structure includes a pad and a conductive via. The pad electrically connects to the first circuit layer. A linewidth of the first circuit layer is smaller than a linewidth of the second circuit layer. A manufacturing method of the circuit carrier board is also provided.

11 Claims, 16 Drawing Sheets

Related U.S. Application Data

(60) Provisional application No. 62/682,181, filed on Jun. 8, 2018.

(51) Int. Cl.
*H05K 3/00* (2006.01)
*H05K 3/40* (2006.01)
*H05K 1/11* (2006.01)

(52) U.S. Cl.
CPC ......... *H05K 3/4015* (2013.01); *H05K 3/4661* (2013.01); *H05K 2201/10234* (2013.01); *H05K 2201/10522* (2013.01); *H05K 2201/10734* (2013.01)

(56) References Cited

U.S. PATENT DOCUMENTS

| | | | |
|---|---|---|---|
| 9,412,687 B2 | 8/2016 | Kunimoto et al. | |
| 2006/0272853 A1* | 12/2006 | Muramatsu | H01L 21/4857 174/262 |
| 2015/0364405 A1* | 12/2015 | Kunimoto | H01L 23/49833 174/251 |

OTHER PUBLICATIONS

"Office Action of Taiwan Related Application, application No. 107136704", dated Dec. 13, 2019, pp. 1-5.

\* cited by examiner

CIRCUIT CARRIER BOARD AND MANUFACTURING METHOD THEREOF

CROSS-REFERENCE TO RELATED APPLICATION

This application is a continuation-in-part application of U.S. application Ser. No. 16/244,113, filed on Jan. 10, 2019, which claims the priority benefits of U.S. provisional application Ser. No. 62/682,181, filed on Jun. 8, 2018, and Taiwan application serial no. 107136704, filed on Oct. 18, 2018. This application also claims the priority benefit of Taiwan application serial no. 108115660, filed on May 7, 2019. The entirety of each of the above-mentioned patent applications is hereby incorporated by reference herein and made a part of this specification.

BACKGROUND

Technical Field

The present invention relates to a circuit carrier board and a manufacturing method thereof, and more particularly to a circuit carrier board having a circuit layer with different linewidths.

Description of Related Art

In general, the multilayer circuit structure of a circuit board is mostly manufactured by a build-up method or a laminated method, and thus has the features of high circuit density and reduced circuit spacing. For example, the multilayer circuit structure is formed by combining a copper foil and a PrePreg into a build-up layer structure and stacking the build-up layer structure on a core layer via repeated lamination to increase the internal wiring space of the multilayer circuit structure, wherein the conductive material on the build-up layer structure may form conductive circuits according to the required circuit layout, and the blind vias or through-holes of the build-up layer structure may be additionally filled with a conductive material to conduct each of the layers. Thus, the multilayer circuit structure may be manufactured by adjusting the number of circuit structures according to requirements and via the above method.

With the advancement of technology, all kinds of electronic products are developed to have high speed, high efficiency, and be compact. Under this trend, how to design circuit boards to enable a plurality of chips with high-density circuits to communicate with each other, and improve signal transmission efficiency between the chips, is an urgent problem to be solved in the field.

SUMMARY

The invention provides a circuit carrier board and a manufacturing method thereof, which are adapted to interconnect electronic elements with a plurality of high density circuits, reducing signal delay and improving performance of the circuit carrier board.

The manufacturing method of the circuit carrier board of the invention comprises the following steps. A first temporary carrier board is provided. A first substrate is formed on the first temporary carrier board. The first substrate includes a first circuit layer and a plurality of conductive structures, and the conductive structures are adapted to be electrically connected to the plurality of electronic elements. A bonding step is performed so as to bond the first substrate to the second temporary carrier board. The conductive structures are located between the first circuit layer and the second temporary carrier boards. The first temporary carrier board is removed. A second substrate is formed on the first substrate to bond the second substrate to the first substrate. The second substrate includes a plurality of dielectric layers and a plurality of second circuit layers, and the second circuit layers are disposed in the dielectric layer. The bottommost layer of the second circuit layers is exposed outside of the dielectric layer, and the topmost layer of the second circuit layers is electrically connected to the first circuit layer. And, the second temporary carrier board is removed.

In an embodiment of the invention, the step of forming the first substrate includes forming a release layer on the first temporary carrier board. The first circuit layer is formed on the release layer. An insulating layer is formed on the release layer and covers the first circuit layer. A conductive structure is formed on the insulating layer, and the conductive structure is electrically connected to the first circuit layer. An insulating adhesive material is formed on the insulating layer, and the conductive structure is located between the insulating adhesive material and the insulating layer.

In an embodiment of the invention, the step of forming the first substrate further includes performing a thinning process to remove a portion of the insulating adhesive material to form an insulating adhesive layer and exposing the conductive structure.

In an embodiment of the invention, the step of forming the second substrate includes forming the dielectric layers stacked on the first substrate in sequence. The second circuit layers are formed in the dielectric layers, and the second circuit layers are electrically connected to one another.

In an embodiment of the invention, the step of forming the first substrate includes forming the release layer on the first temporary carrier board. The first circuit layer is formed on the release layer. And the insulating adhesive material is formed on the first circuit layer.

In an embodiment of the invention, the step of forming the first substrate further includes: after the step of forming the second substrate on the first substrate, a plurality of contact windows are formed in the insulating adhesive material to form the insulating adhesive layer. The conductive structure is formed in the insulating adhesive layer, and the conductive structure is electrically connected to the first circuit layer through the contact windows.

In an embodiment of the invention, the manufacturing method of the circuit carrier board further includes forming a plurality of solder resist layers on the first substrate and the second substrate respectively. The solder resist layers partially cover the conductive structures and the bottommost layer of the second circuit layers. A plurality of solder balls are disposed and electrically connected to the bottommost layer of the second circuit layers.

A circuit carrier board of the invention includes a first substrate and a second substrate bonded to the first substrate. The first substrate includes a first circuit layer and a plurality of conductive structures that are electrically connected to the first circuit layer. The conductive structures are adapted to be electrically connected to a plurality of electronic elements. The second substrate contacts the first circuit layer, and the second substrate includes a plurality of dielectric layers stacked on the first substrate in sequence, and a plurality of second circuit layers are disposed in the dielectric layer. The bottommost layer of the second circuit layers is exposed outside of the dielectric layers, and the topmost layer of the second circuit layers is electrically connected to the first circuit layer. The conductive structure includes a pad and a conductive via. The pad is electrically connected to the first circuit layer through the conductive via. An orthographic projection of each conductive via contacting a bottom surface of the first circuit layer on the second substrate is located within an orthographic projection of a top surface of each pad on the second substrate. A linewidth of the first circuit layer is smaller than a linewidth of the second circuit layer.

In an embodiment of the invention, the first substrate further includes an insulating layer and an insulating adhesive layer. The first circuit layer is embedded in a surface of the insulating layer. The insulating adhesive layer is disposed on the other surface of the insulating layer opposite to the surface. The conductive structures are disposed in the insulating layer. Each pad is disposed on the other surface, and the insulating adhesive layer surrounds each pad.

In an embodiment of the invention, the first substrate further includes the insulating adhesive layer. The first circuit layer is embedded in a surface of the insulating adhesive layer, and the insulating adhesive layer has a plurality of contact windows. The conductive structures are disposed in the insulating adhesive layer, and a portion of the pad is disposed on the other surface opposite to the surface. The conductive via is filled in the contact window to contact the first circuit layer.

In an embodiment of the invention, the circuit carrier board further includes a plurality of solder resist layers respectively disposed on the first substrate and the second substrate, and a plurality of solder balls are disposed on the second substrate. The solder resist layers partially cover the conductive structures and the bottommost layer of the second circuit layers. The solder balls are electrically connected to the bottommost layer of the second circuit layers.

In an embodiment of the invention, the circuit carrier board further includes a plurality of surface-treated metal pads. The metal pads are respectively contacted and disposed on the pads and on the bottommost layer of the second circuit layers.

Based on the above, in the circuit carrier board sand the manufacturing method thereof of the invention, the second substrate having a normal linewidth can be directly formed and bonded to the entire surface of the first substrate having the first circuit layer with the ultra-fine linewidth. Therefore, the first circuit layer and the second circuit layer made of different fineness in linewidth can be directly integrated onto the circuit carrier board, which simplifies the process, reduces the cost, and improves the wiring margin. In addition, a plurality of electronic elements having high density circuits can be directly electrically connected to the conductive structures of the first substrate, and thus the electronic elements can achieve interconnectivity through the first circuit layer. In this way, signal delay between interconnected electronic elements can be reduced and the performance of the circuit carrier board can be improved. In addition, the plurality of build-up layers of the second substrate can support the first substrate, thereby improving the overall rigidity and the reliability of the structure of the circuit carrier board.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
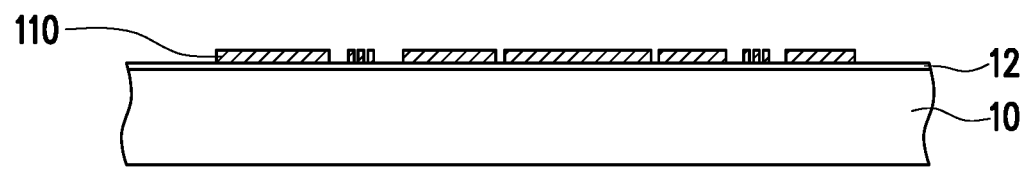
FIG. 1A to FIG. 1K are cross-sectional views showing a manufacturing process of a circuit carrier board of an embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

Moreover, terms such as "first" and "second" used herein do not represent order, and it should be understood that they are for differentiating devices or operations having the same technical terms.

Secondly, the terms "containing", "including", "having" and the like as used herein are all open terms; i.e., including but not limited to.

Furthermore, the terms "in contact with", "connected to", "bonded to" and the like, as used herein, may mean direct contact or indirect contact via other layers unless otherwise stated.

Figure 1B:
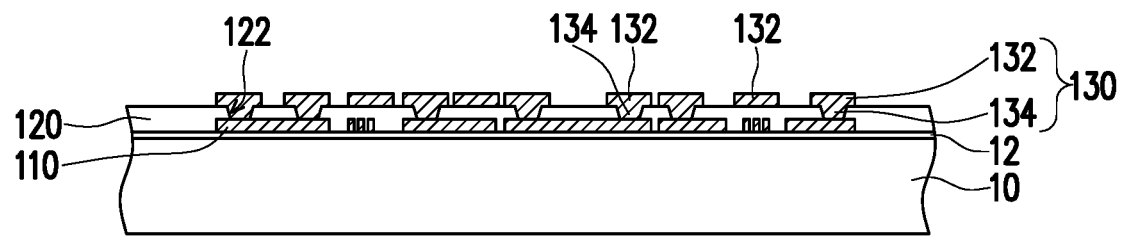
Figure 1C:
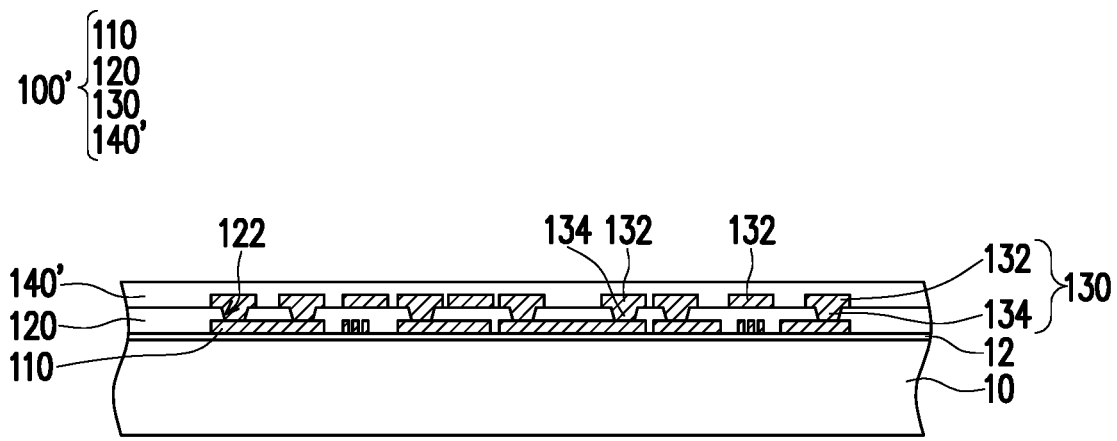
Figure 1D:
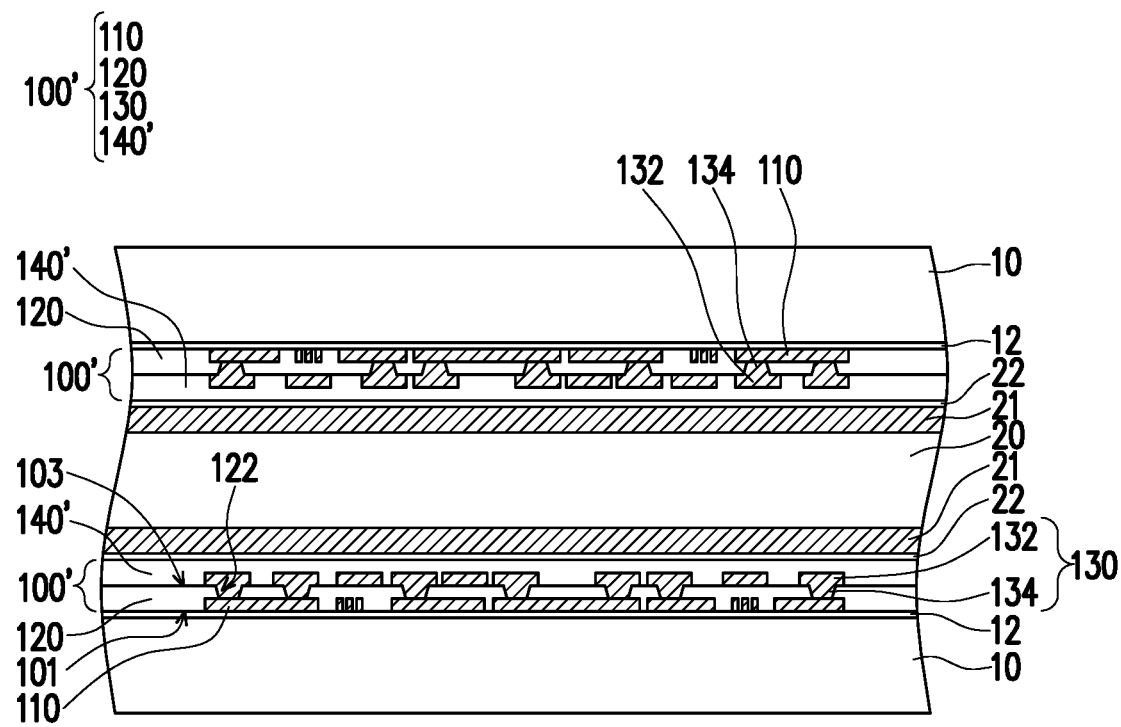
Figure 1E:
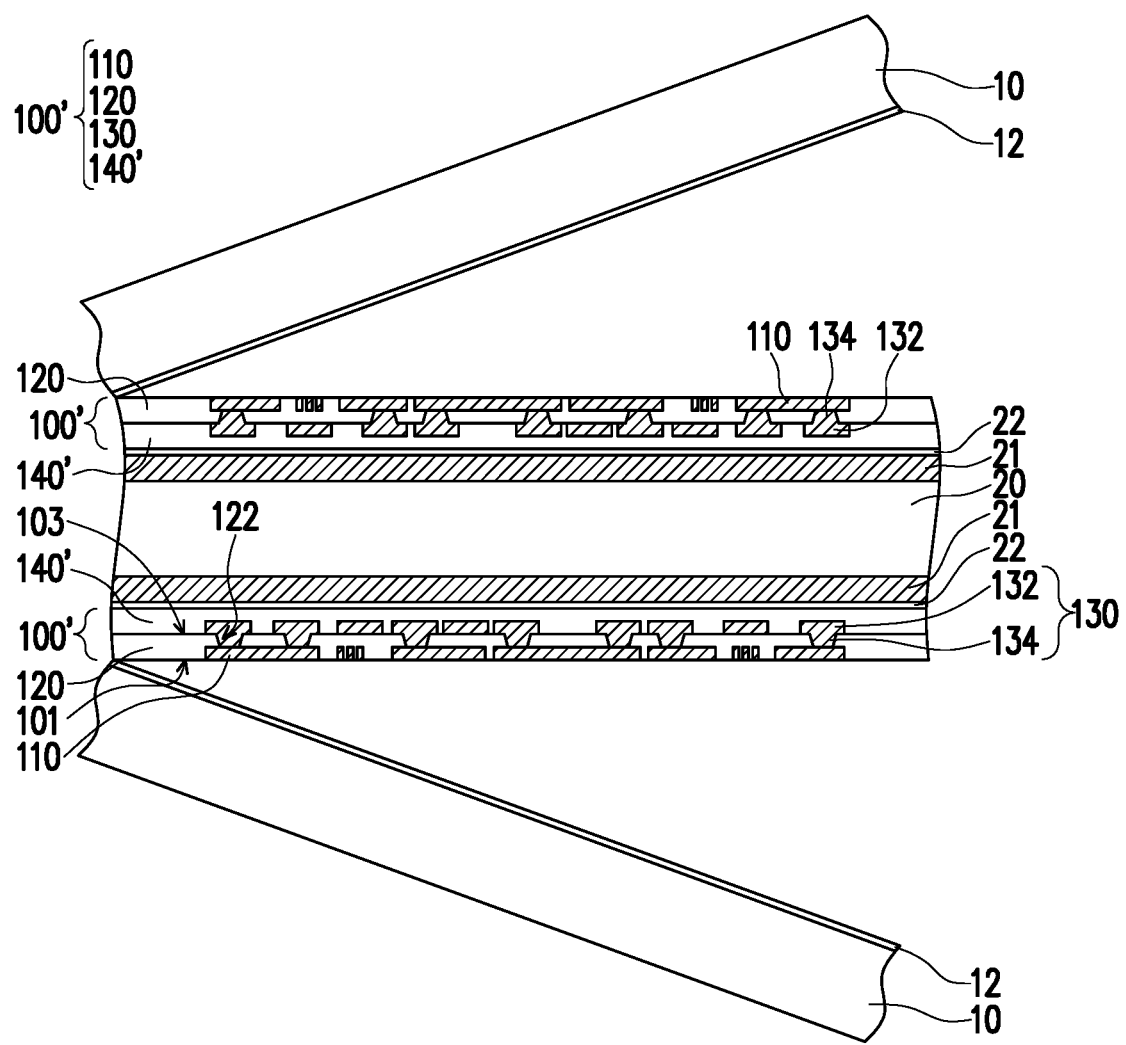
Figure 1F:
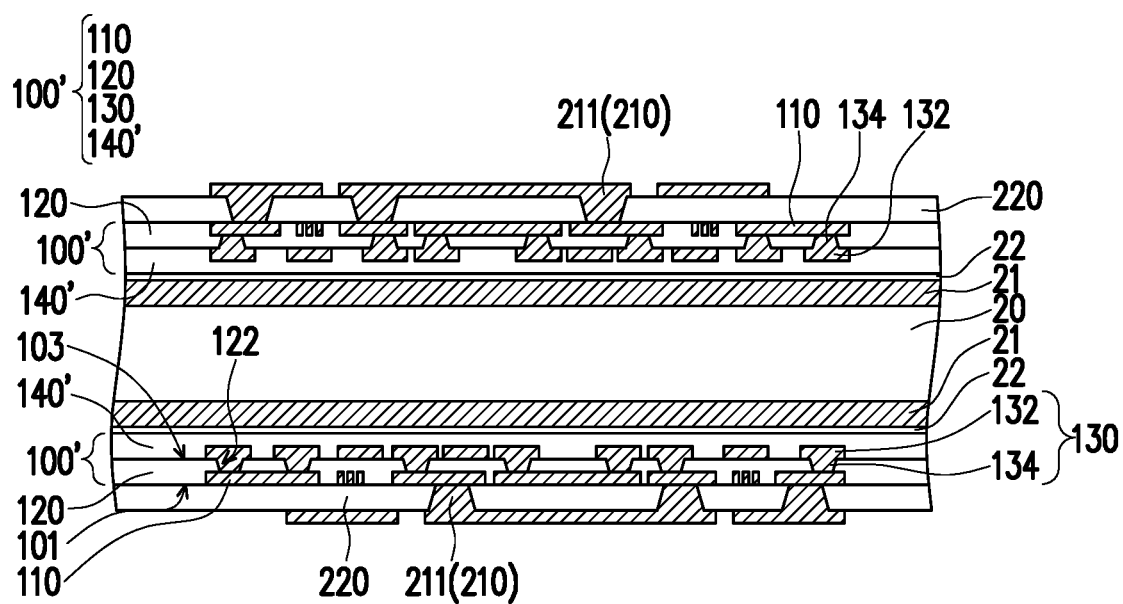
Figure 1G:
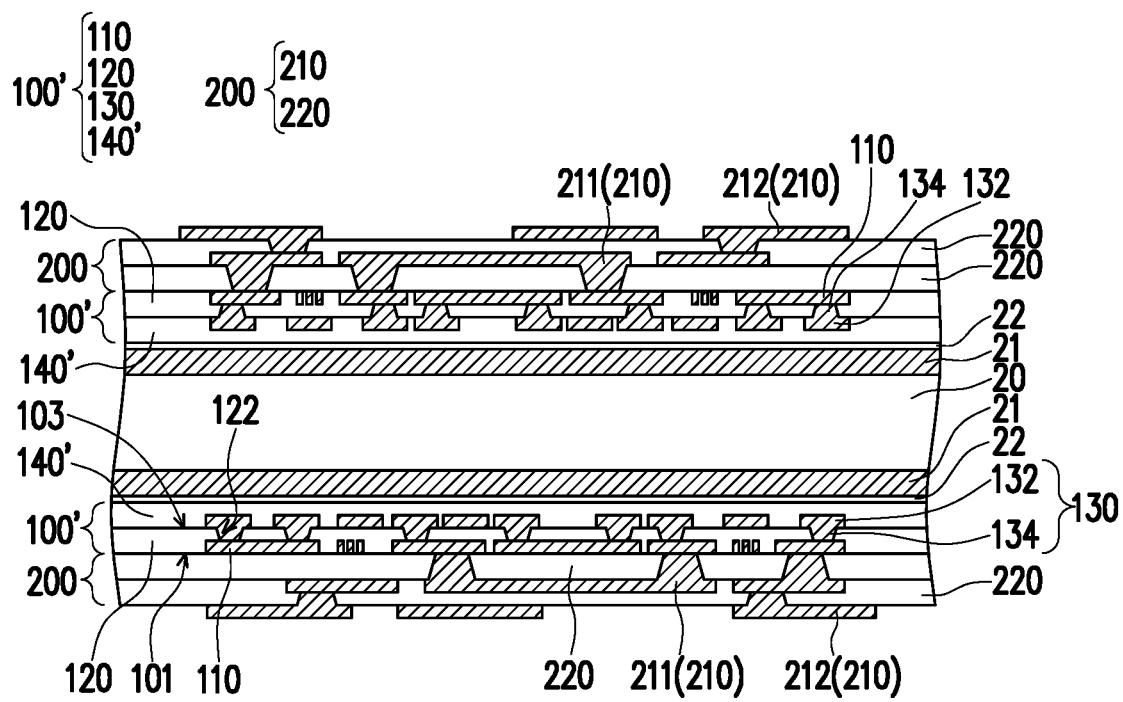
Figure 1H:
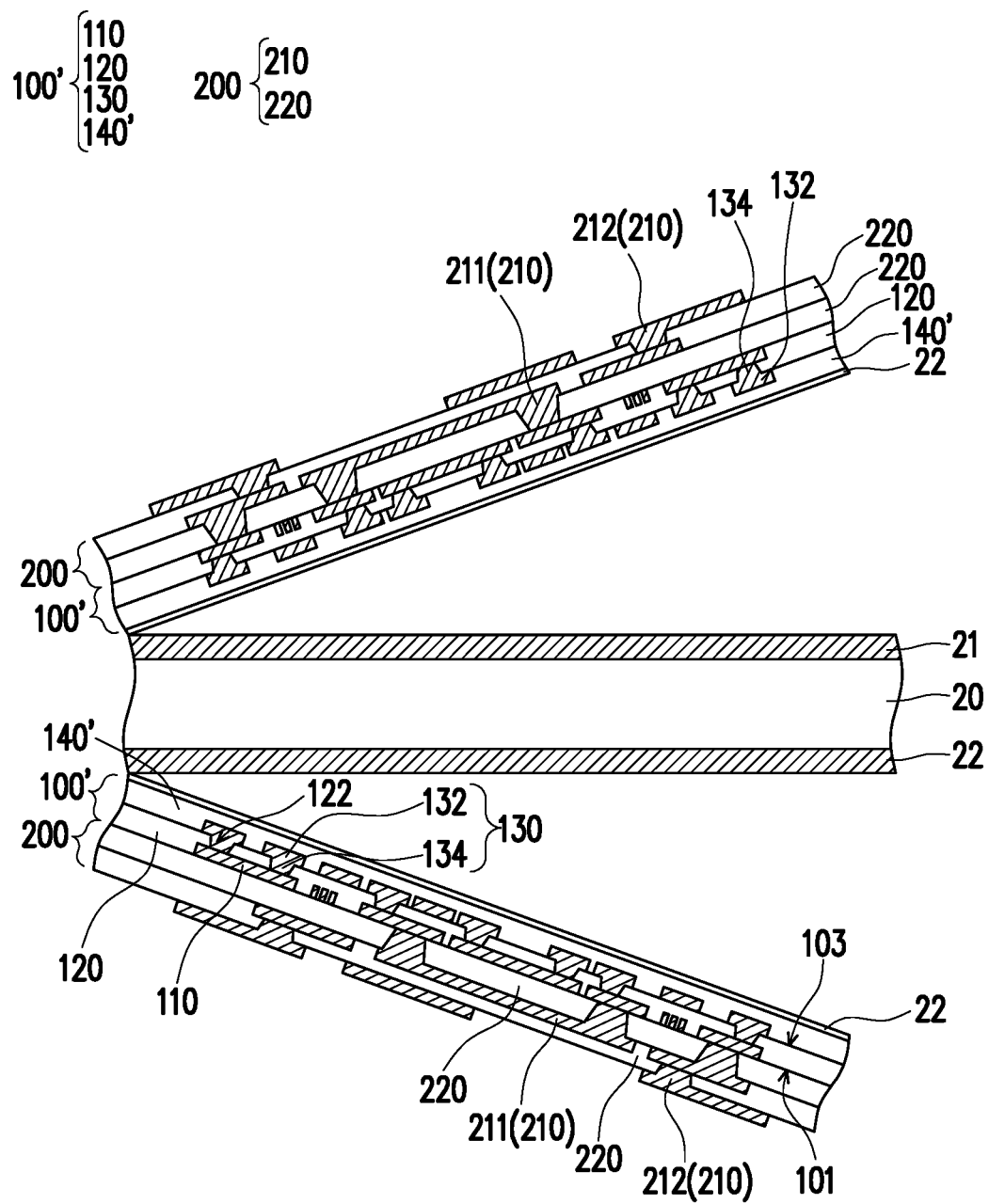
Figure 1I:
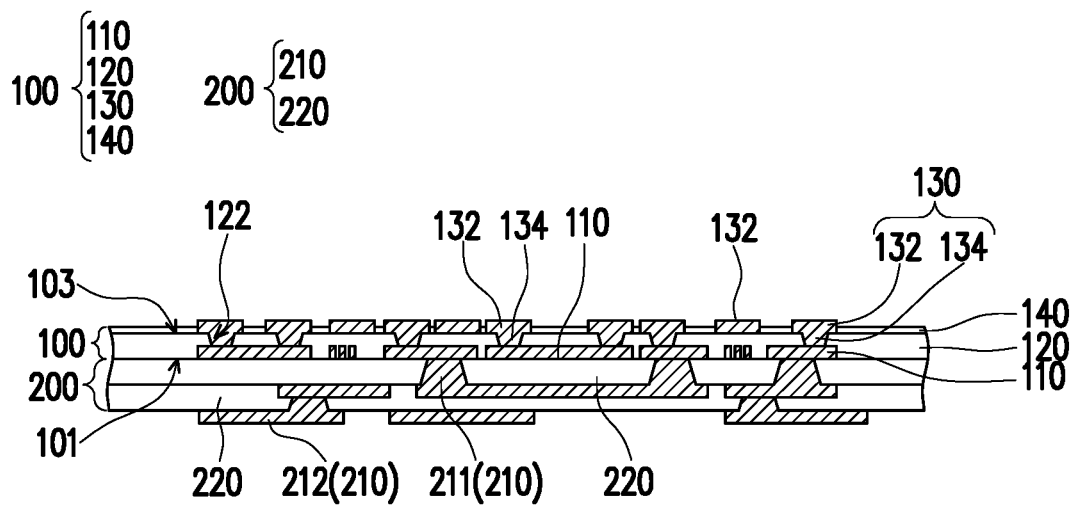
Figure 1J:
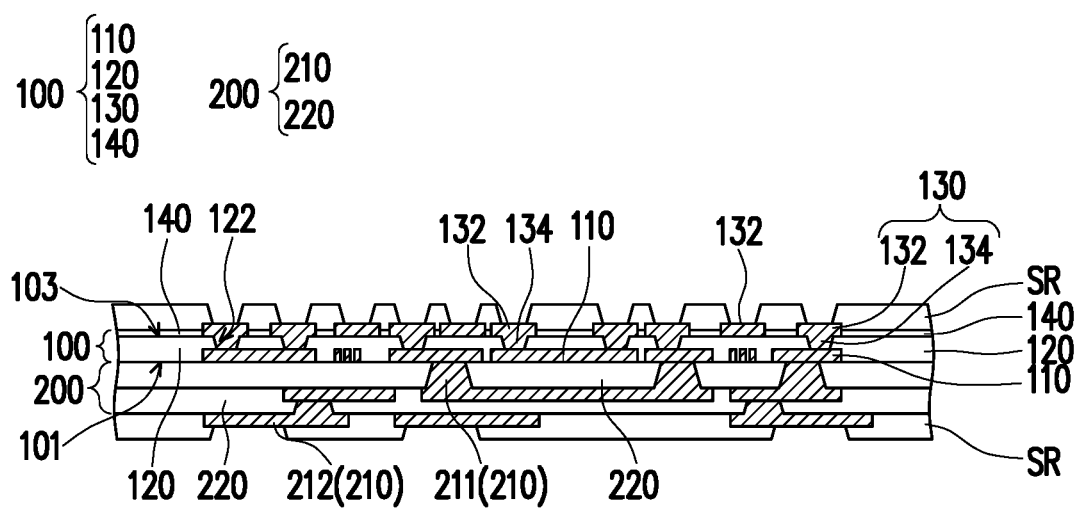
Figure 1K:
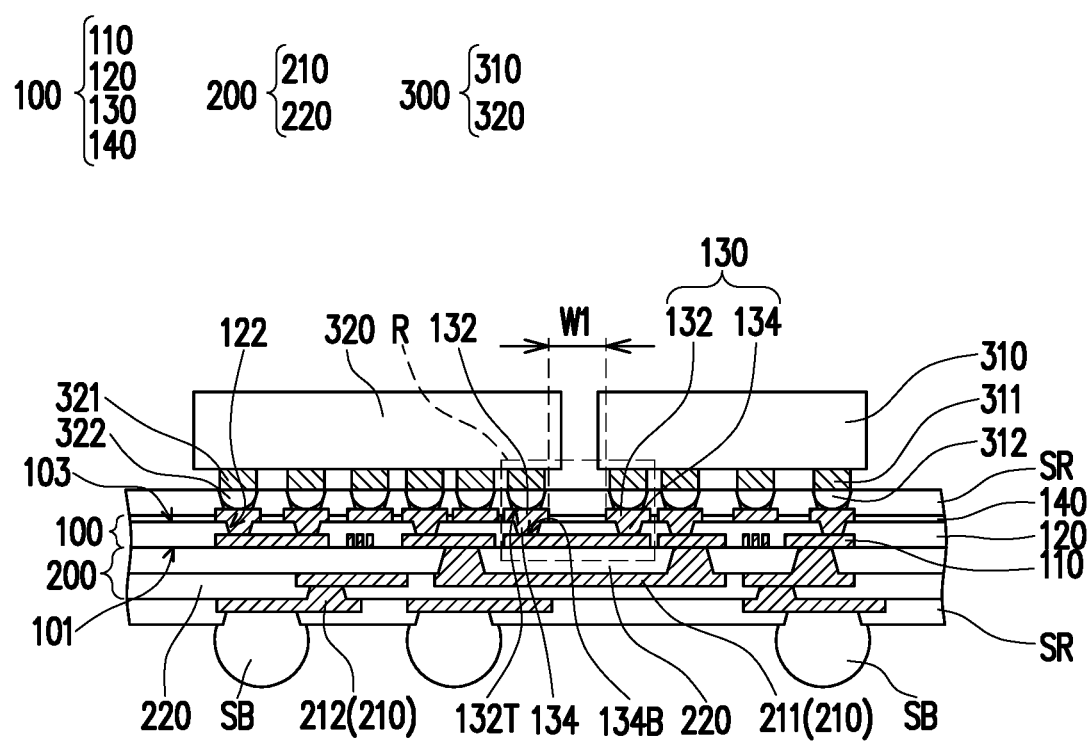

FIG. 1A to FIG. 1K are cross-sectional views showing a manufacturing process of a circuit carrier board of an embodiment of the invention. Referring to FIG. 1K first, in the present embodiment, the circuit carrier board 1 includes a first substrate 100 and a second substrate 200, which is bonded to the first substrate 100. The first substrate 100 includes a first circuit layer 110 and a plurality of conductive structures 130 electrically connected to the first circuit layer 110. The conductive structures 130 are adapted to be electrically connected to the plurality of electronic elements 300 disposed on the first substrate 100. The second substrate 200 contacts the first circuit layer 110, and includes a plurality of dielectric layers 220 sequentially stacked on the first substrate 100, and a plurality of second circuit layers 210 are disposed in the dielectric layers 220. The bottommost layer 212 of the second circuit layers 210 is exposed to be outside of the dielectric layer 220, and the topmost layer 211 of the second circuit layers 210 is electrically connected to the first circuit layer 110. The circuit carrier board 1 further includes a plurality of solder resist layers SR respectively disposed on the first substrate 100 and the second substrate 200, and a plurality of solder balls SB disposed on the second substrate 200 to be electrically connected to the bottommost layer 212 of the second circuit layers 210. The following description will briefly explain the manufacturing method of the circuit carrier board 1 according to an embodiment.

Referring to FIG. 1A, FIG. 1B and FIG. 1C, the manufacturing method of the circuit carrier board 1 (shown in FIG. 1K) includes the following steps. First, as shown in FIG. 1A, a first temporary carrier board 10 is provided.

Next, a first substrate 100' (shown in FIG. 1C) is formed on the first temporary carrier board 10. In the present embodiment, the first substrate 100' may be a single layer or a stacked structure of multilayer. As shown in FIG. 1A, the step of forming the first substrate 100' includes forming a release layer 12 on the first temporary carrier board 10 first, and then the first wiring layer 110 is formed on the release layer 12. The release layer 12 may be a photo-curable release film or a thermal curable release film, but the invention is not limited thereto. The viscosity of the photo-curable release film is reduced by a photo-curing process; and the viscosity of the thermal curable release film is reduced by thermal-curing process. In other embodiments, the release layer 12 may also be a laser debond release film.

In the present embodiment, the first circuit layer 110 is disposed by an ultra-fine line process. For example, the linewidth D1 of the first circuit layer 110 (shown in FIG. 2B) may be less than or equal to 5 microns. In some embodiments, the linewidth D1 of the first circuit layer 110 may be selectively between 1 micron and 5 microns, but the invention is not limited thereto. Under the above arrangement, the first circuit layer 110 can meet the demand of ultra-fine lines. Based on conductivity considerations, the first circuit layer 110 is generally made of a metal material, for example, including copper, aluminum, silver, gold, or other suitable materials, but the invention is not limited thereto. According to other embodiments, the first circuit layer 110 may also use other conductive materials such as including an alloy, an oxide of a metal material, a nitride of a metal material, an oxynitride of a metal material, or stacked layers of a metal material and other conductive materials. In the present embodiment, the method of forming the first circuit layer 110 includes electroplating or chemical plating (or known as electroless plating), but the invention is not limited thereto.

Then, referring to FIG. 1B, a plating process is performed to form the insulating layer 120 on the release layer 12 and cover the first circuit layer 110. In other words, the insulating layer 120 and the first wiring layer 110 can be used as one of the build-up layers in the multilayer structure of the first substrate 100'. In some embodiments, the build-up layers combined by the first circuit layer 110 and the insulating layer 120 may be sequentially stacked to form a build-up of two, three or more layers. The plurality of first circuit layers 110 in the multilayer build-up layer can be electrically connected to one another through a plurality of through holes penetrating the insulating layer 120. FIG. 1B of the embodiment is illustrated with only one layer of the first circuit layer 110 and one layer of the insulating layer 120 for clarity purpose. In fact, the number of the first circuit layer 110 and the insulating layer 120 is not limited by the number shown in FIG. 1B.

Next, a plurality of contact windows 122 are formed on the insulating layer 120 to expose a portion of the first circuit layer 110. Then, conductive structures 130 are formed on the insulating layer 120, and the conductive structures 130 may be filled in the contact windows 122 to be electrically connected to the first circuit layer 110. In the present embodiment, the material of the insulating layer 120 comprises a dielectric material not including a glass fiber cloth, for example, the material can be selected from the group consisting of Ajinomoto build-up film (ABF), adhesive, and photosensitive dielectric material (photoimageable dielectric, PID) or a photosensitive polymer (such as benzocyclobutene) or a combination thereof, but the invention is not limited thereto. In some embodiments, the material of the insulating layer 120 may also include a dielectric material with adhesiveness, for example, including an epoxy resin, but the invention is not limited thereto. In the present embodiment, the method of forming the plurality of contact windows 122 includes photolithography, mechanical drilling, laser drilling, or other suitable methods, the invention is not limited thereto.

In detail, a portion of the conductive structure 130 is formed on the insulating layer 120, and another portion is formed in the insulating layer 120. As shown in FIG. 1B, the conductive structure 130 may include pads 132 and conductive vias 134 electrically connected to the pads 132. The pads 132 are disposed on the insulating layer 120, and the conductive vias 134 are filled in the contact windows 122. In this manner, the pads 132 on the insulating layer 120 can be electrically connected to the portion of the first circuit layer 110 exposed by the contact windows 122 through the conductive vias 134 in the insulating layer 120. In the present embodiment, a portion of the pads 132 may also not contact the conductive vias 134 and serve as structures that interconnect other conductive structures 130 located in the same plane. The above-mentioned portion of the pads 132 and the pads 132 connected to the conductive vias 134 can be formed through the same patterning process, and thus can be regarded as a part of the conductive structure 130, but the invention is not limited thereto. In other words, in some embodiments, the structures that horizontally interconnect the conductive vias 134 can also be completed in additional steps as needed.

In the present embodiment, based on conductivity considerations, the conductive structure 130 (including the pads 132 and the conductive vias 134) generally includes a metal or a metal alloy such as molybdenum, aluminum, titanium, copper, gold, silver or other metal conductive materials or a stack of two or more of the above materials or an alloy of two or more of the above materials, the invention is not limited thereto. In the present embodiment, the method of forming the conductive structure 130 includes electroplating or chemical plating, but the invention is not limited thereto. In some embodiments, the conductive structure 130 may also be formed by Physical Vapor Deposition (PVD), Chemical Vapor Deposition (CVD), or Atomic Layer Deposition (ALD).

Then, referring to FIG. 1C, an insulating adhesive material 140' is formed on the insulating layer 120 and covers the conductive structure 130 and the insulating layer 120. In other words, the conductive structure 130 may be located between the insulating adhesive material 140' and the insulating layer 120. So far, the manufacturing of the first substrate 100' that has not exposed the pads 132 is substantially completed. That is, the first substrate 100' is an ultra-fine line circuit substrate that includes a build-up layer of the first circuit layer 110 and the insulating layer 120, the conductive structures 130 electrically connected to the first circuit layer 110, and an insulating adhesive material 140' covering the conductive structure 130. From another point of view, the first substrate 100' is, for example, a redistribution layer (RDL) using ultra-fine line technology, but the invention is not limited thereto. In the present embodiment, the material of the insulating adhesive material 140' comprises a thermosetting polymer or a photopolymer. The thermosetting polymer includes, for example, a polyester resin, a polyurethanes, a melamine resin, an Ajinomoto build-up film (ABF), an epoxy resin, a polyimides, a silicone or a vinyl ester. A photopolymer includes, for example, an acrylate or an epoxy resin. However, the invention is not limited thereto.

Next, referring to FIG. 1D, a bonding step is performed to bond the first substrate 100' to the second temporary carrier board 20. In the present embodiment, metal layers 21 are disposed on the two opposite surfaces of the second temporary carrier board 20, and the release layers 22 are respectively disposed on the two metal layers 21. As shown in FIG. 1D, the insulating adhesive material 140' of the first substrate 100' is bonded to the release layer 22 on the second temporary carrier board 20. In addition, the conductive structure 130 is located between the first circuit layer 110 and the second temporary carrier board 20. From another perspective, the first circuit layer 110 is located on a surface 101 of the insulating layer 120 away from the second temporary carrier board 20. In fact, the first circuit layer 110 is embedded on the surface 101 of the insulating layer 120. In addition, the pad 132 may be disposed on the other surface 103 of the insulating layer 120 opposite to the surface 101, and the insulating adhesive material 140' is disposed on the other surface 103 to cover the pad 132, but the invention is not limited thereto.

In the present embodiment, the second temporary carrier board 20 may be a glass substrate, a silicon substrate (Si substrate), a ceramic substrate, or a combination thereof, but the invention is not limited thereto. The material of the metal layer 21 is, for example, a metal or an alloy, including aluminum, copper, silver, gold or an alloy of the above metals or other suitable materials, and the invention is not limited thereto. From another point of view, the second temporary carrier board 20 is, for example, a double-sided copper clad laminate (CCL) substrate, but the invention is not limited thereto. In the present embodiment, the release layer 22 may be a photo-curable release film or a thermal curable release film, but the invention is not limited thereto. In other embodiments, the release layer 22 may also be a laser debond release film.

In the present embodiment, as shown in FIG. 1D, two first substrates 100' (such as a top first substrate 100' and a bottom first substrate 100') can be simultaneously bonded to the second temporary carrier board 20, so that in the subsequent steps, the second substrate 200 (shown in FIG. 1G) may be formed on the first substrate 100' at the top and on the first substrate 100' at the bottom simultaneously. In this way, the manufacturing process can be simplified and the production cost can be reduced. The following steps will be mainly described by the first substrate 100' below the second temporary carrier board 20. It should be understood by those skilled in the art that the first substrate 100' located above the second temporary carrier board 20 is the same as the process steps performed by the first substrate 100' below, therefore details are not repeated herein.

Then, referring to FIG. 1D and FIG. 1E, the first temporary carrier board 10 and the release layer 12 formed on the first temporary carrier board 10 are removed to expose the first circuit layer 110. The method of removing the first temporary carrier board 10 includes, for example, reducing the viscosity of the release layer 12 by illumination, heating, or by laser dissociation, thereby separating the first temporary carrier board 10 from the first substrate 100'.

Next, referring to FIG. 1F and FIG. 1G, the second substrate 200 is formed on the first substrate 100'. In the present embodiment, the second substrate 200 includes a plurality of build-up layers formed by sequentially stacking a plurality of dielectric layers 220 and a plurality of second circuit layers 210 on the first substrate 100'. For example, as shown in FIG. 1F and FIG. 1G, the step of forming the second substrate 200 includes sequentially stacking the plurality of dielectric layers 220 on the first substrate 100'. One of the dielectric layers 220 is disposed on the surface 101 of the insulating layer 120. That is, in this embodiment, the second substrate 200 is disposed on the insulating layer 120. Then, the plurality of the second circuit layers 210 are formed in the dielectric layers 220, and the second circuit layers 210 located at different horizontal film layers are electrically connected to one another. In another aspect, each of the second circuit layers 210 and each of the dielectric layers 220 may define a single build-up layer of the second substrate 200, and the plurality of the above-mentioned build-up layers may be sequentially stacked on the first substrate 100' so as to form the second substrate 200. In the present embodiment, the second substrate 200 includes, for example, two of the above-mentioned build-up layers, but the invention is not limited thereto. In some embodiments, the second substrate 200 may also include one, or three or more build-up layers, and is not limited to the number shown in FIG. 1G. The following description will be made with the second substrate 200 including two build-up layers of one upper build-up layer and one lower build-up layer.

In the present embodiment, as shown in FIG. 1F and FIG. 1G, the upper build-up layer (not labeled) may be defined as the topmost dielectric layer 220 and the second circuit layer 210 in the topmost dielectric layer 220 that contacts the first substrate 100'. The topmost dielectric layer 220 may form a plurality of contact windows (not labeled) to expose portions of the first circuit layer 110. A second circuit layer 210 formed on the topmost dielectric layer 220 may be filled in the contact windows to be electrically connected to the first circuit layer 110. In the present embodiment, as shown in FIG. 1F and FIG. 1G, the second circuit layer 210 electrically connected to the first circuit layer 110 may be defined as the topmost layer 211 of the second circuit layer 210.

Then, the lower build-up layer (not labeled) is stacked on the surface of the upper build-up layer. For example, the lower build-up layer can be defined as the bottommost dielectric layer 220 and the second circuit layer 210 in the bottommost dielectric layer 220 that contacts the upper build-up layer. The bottommost dielectric layer 220 may form a plurality of contact windows (not labeled) to expose portions of the topmost layer 211. The second circuit layer 210 formed on the bottommost dielectric layer 220 may be filled in the contact windows to be electrically connected to the topmost layer 211. In the present embodiment, as shown in FIG. 1G, the second circuit layer 210 electrically connected to the topmost layer 211 can be defined as the bottommost layer 212 of the second circuit layer 210, and the above-mentioned bottommost layer 212 can be exposed to be outside of the bottommost dielectric layer 220.

In the present embodiment, the material of the dielectric layer 220 includes a PrePreg, a photosensitive dielectric material (such as a PID), a photosensitive polymer (for example, benzocyclobutene), an ABF. Build-up film), a resin coated cooper foil (RCC), a fiberglass resin composite or a combination thereof, but the invention is not limited thereto.

In this embodiment, portions of the plurality of second circuit layers 210 may penetrate through the dielectric layers 220 to electrically connect the second circuit layers 210 of different horizontal planes to each other, and another portion of the second circuit layers 210 are only interconnected to the second circuit layer 210 located on the same horizontal plane. In other words, the second circuit layer 210 can provide the need for the horizontal and vertical trace interconnection that is required for the second substrate 200.

In the present embodiment, the second circuit layer 210 can be disposed by a process of a normal trace requirement or by a process of a high density trace requirement. For example, the linewidth of the second circuit layer 210 may be 5 microns to hundreds of microns, but the invention is not limited thereto. In some embodiments, the thinnest linewidth of the second circuit layer 210 may selectively be 8 microns to 25 microns, but the invention is not limited thereto. Based on conductivity considerations, the second circuit layer 210 is generally made of a metal material, for example, including copper, aluminum, silver, gold, or other suitable materials, but the invention is not limited thereto. According to other embodiments, the second wiring layer 210 may also use other conductive materials including an alloy, an oxide of a metal material, a nitride of a metal material, an oxynitride of a metal material, or a stacked layers of a metal material and other conductive materials. In the present embodiment, the method of forming the second circuit layer 210 includes electroplating or chemical plating, but the invention is not limited thereto.

Then, referring to FIG. 1G and FIG. 1H, the second temporary carrier board 20 is removed to separate the release layer 22 from the second temporary carrier board 20. The method of removing the second temporary carrier board 20 includes, for example, reducing the viscosity of the release layer 22 by illumination, heating or by laser dissociation, thereby separating the metal layer 21 on the second temporary carrier board 20 from the release layer 22. So far, the steps of manufacturing the second substrate 200 and bonding the second substrate to the first substrate 100' is substantially completed. That is, the second substrate 200 is a circuit board with two build-up layers, each including a second circuit layer 210 and a dielectric layer 220. In the present embodiment, the second substrate 200 having the second circuit layer 210 is, for example, a substrate applying the technologies of a high density interconnect (HDI) board, a coreless substrate, or an any-layer printed circuit board.

It should be noted that, the embodiment can directly dispose the second substrate 200 with normal linewidths, which indicates that the second substrate 200 does not apply the ultra-fine line technology, on the first substrate 100' having the first circuit layer 110 with ultra-fine lines. In this way, the present invention can directly connect the first circuit layer 110 having a smaller linewidth to the second circuit layer 210 having a larger linewidth by a simple process. Therefore, the manufacturing process can be simplified and the cost can be reduced.

Next, referring to FIG. 1H and FIG. 1I, in the present embodiment, the step of forming the first substrate 100 further includes performing a thinning process. The thinning process described above may remove a portion of the insulating adhesive material 140' to form the insulating adhesive layer 140 and expose the pads 132 of the conductive structures 130. In the embodiment, the release layer 22 may be removed prior to the step of the thinning process. The method of removing the release layer 22 is similar to the method of removing the second temporary carrier board 20, and therefore details are not repeated herein, but the invention is not limited thereto. In some embodiments, the release layer 22 may also be removed during the thinning process is being performed.

Figure 2A:
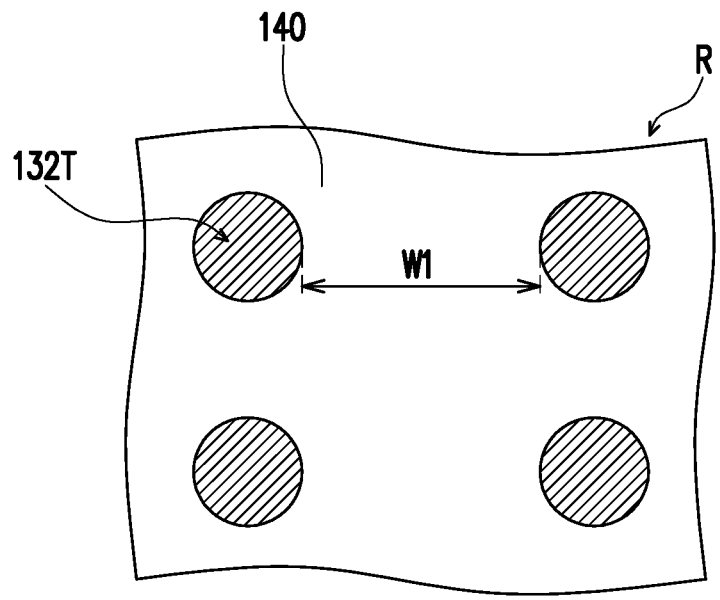
FIG. 2A is a partial top view showing the top surface of the pad in the region R of FIG. 1A.

In the present embodiment, the thinning process includes the use of a reactive ion-etching (RIE) process, a half tone mask (HTM), a gray tone mask, or a phase shift mask to perform a developing process to remove a portion of the insulating adhesive material 140', but the invention is not limited thereto. Under the above arrangement, the formed insulating adhesive layer 140 may expose the pad 132 and partially contact the sidewall of the pad 132 (not labeled). In short, the first substrate 100' to which the pads 132 have not been exposed is subjected to a thinning process to expose the pads 132, thereby completing the fabrication of the first substrate 100. In the present embodiment, the insulating adhesive layer 140 surrounds and contacts the edge of the pad 132 (as shown in FIG. 2A), and the pad 132 is partially exposed, thus the pad 132 can be partially embedded in the insulating adhesive layer 140. From another perspective, the pads 132 of the conductive structures 130 have the insulating adhesive layer 140 therebetween. In this way, the insulating adhesive layer 140 not only may increase the structural reliability of the pads 132, but also protect the pads 132 and the insulating layer 120. In addition, the insulating adhesive layer 140 may also have a solder resist effect, and the step of disposing the solder resist layer SR may be omitted to simplify the manufacturing process and reduced the production cost.

Then, referring to FIG. 1J, a plurality of solder resist layers SR are respectively formed on the first substrate 100 and the second substrate 200. In the present embodiment, the two solder resist layers SR partially cover the conductive structures 130 on the first substrate 100 and the bottom layer 212 of the second circuit layers 210 on the second substrate 200 respectively. For example, the solder resist layer SR on the first substrate 100 and the solder resist layer SR on the second substrate 200 may each have a plurality of contact windows (not labeled) to respectively expose the pads 132 and the bottom layer 212 of the second circuit layers 210. In the present embodiment, the materials of the solder resist layers SR include a green lacquer, a photosensitive dielectric material, an ABF, and a polymer resin material, but the invention is not limited thereto.

Next, referring to FIG. 1J and FIG. 1K, a plurality of electronic elements 300 are disposed on the first substrate 100 to be electrically connected to the pads 132 and the first circuit layer 110. In the present embodiment, the electronic elements 300 are exemplified as a wafer, but the invention is not limited thereto. As shown in FIG. 1K, the electronic elements 300 include, for example, a first electronic element 310 and a second electronic element 320, and a plurality of conductive bumps 311, 321 are disposed with high density on each of the first electronic element 310 and the second electronic element 320 respectively. In the present embodiment, the first electronic element 310 and the second electronic element 320 further include a plurality of solder balls 312, 322 respectively disposed on the conductive bumps 311, 321, but the invention is not limited thereto. The first electronic element 310 and the second electronic element 320 are electrically connected to the pad 132 through the conductive bumps 311, 321 and the solder balls 312, 322. Based on conductivity considerations, the conductive bumps 311, 321 are generally made of a metal material or alloy, including copper, aluminum, silver, gold, or an alloy of two or more of the above materials, or other suitable materials, but the invention is not limited thereto.

Finally, a plurality of solder balls SB are disposed on the second substrate 200 and electrically connected to the bottommost layer 212 of the second circuit layers 210. At this point, the manufacturing process of the circuit carrier board 1 has been completed.

Figure 2B:
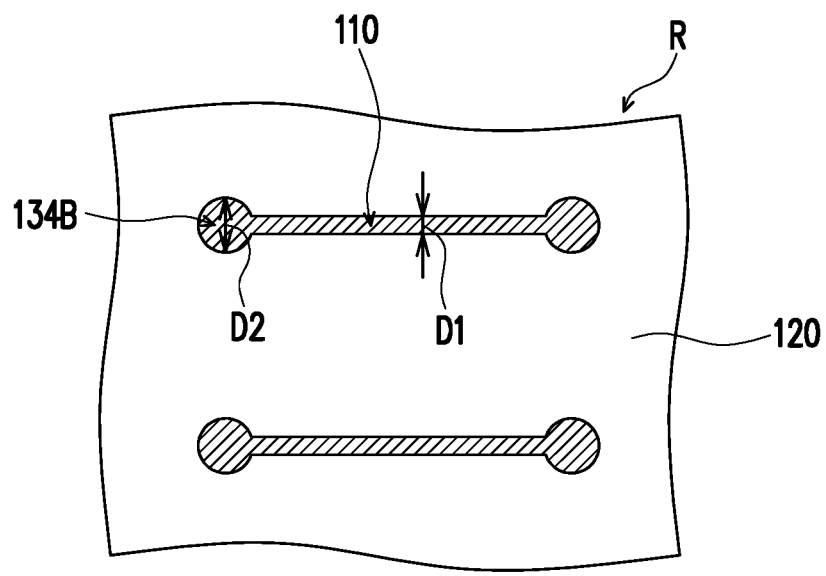
FIG. 2B is a partial top view of the bottom surface of the conductive via and the first circuit layer in the region R of FIG. 1A.

FIG. 2A is a partial top view showing the top surface of the pad in the region R of FIG. 1A, and for convenience of description and observation, FIG. 2A only schematically shows a portion of the components. FIG. 2B is a partial top view of the bottom surface of the conductive via and the first circuit layer in the region R of FIG. 1A, and for convenience of description and observation, FIG. 2B only schematically shows a portion of the components. Referring to FIG. 1 and FIG. 2A, FIG. 2A illustrates the plane where the pads 132 located on the insulating adhesive layer 140 in the region R.

The pad 132 (shown in FIG. 1K) has a top surface 132T. In the present embodiment, since the first substrate 100 is, for example, a redistribution layer (RDL) using ultra-fine line technology, therefore the conductive structures 130 may have fine pitches therebetween. For example, a spacing W1 between any two of the adjacent pads 132 of the conductive structures 130 may be less than or equal to 60 microns. In some embodiments, the minimum spacing W1 between any two of the adjacent pads 132 may selectively be 10 microns to 60 microns.

Referring to FIG. 1 and FIG. 2B, FIG. 2B illustrates the interface of the insulating layer 120 at where the conductive via 134 contacts the first circuit layer 110 in the region R. The conductive via 134 (shown in FIG. 1K) has a bottom surface 134B. In the present embodiment, a diameter D2 of the bottom surface 134B may be less than or equal to 30 microns. In some embodiments, the diameter D2 of the bottom surface 134B can selectively be 10 microns to 30 microns. The linewidth D1 of the first circuit layer 110 may be less than or equal to the diameter D2 of the bottom surface 134B.

With the above arrangement, referring to FIG. 1, FIG. 2A and FIG. 2B, an orthographic projection of the conductive via 134 contacting the bottom surface 134B of the first circuit layer 110 on the second substrate 200 may be located within an orthographic projection of the top surface 132T of the pad 132 on the second substrate 200. In other words, the cross-sectional shape of the conductive via 134 is, for example, a taper, and the portion which contacts the pad 132 has a larger area, and the portion which contacts the first circuit layer 110 has a smaller area. As such, the first circuit layer 110 may have a good design margin under the design of an ultra-fine line manufacturing process.

It should be noted that the circuit carrier board 1 according to an embodiment of the present invention is a redistribution layer using the ultra-fine line technology. Therefore, the circuit carrier board 1 has the first circuit layer 110 having an ultra-fine linewidth and the pads 132 disposed with fine pitch. Under the above arrangement, the electronic elements 300 (including the first electronic element 310 and the second electronic element 320) having high density circuits can be directly electrically connected to the pads 132 and through the first circuit layer. 110 to achieve interconnection between electronic elements 300. In other words, the circuit carrier board 1 is adapted to interconnect the plurality of the electronic components 300 with high density circuits, thereby reducing signal delay and improving the performance of the circuit carrier board 1.

In addition, the electronic elements 300 can also be directly electrically connected to the second conductive layers 210 (including the topmost layer 211 and the bottommost layer 212) of the second substrate 200 through the first conductive layer 100 of the first substrate 100. Therefore, in addition to the first substrate 100 having the ultra-fine linewidth can be bonded to the entire surface of the second substrate 200, and thus simplify the manufacturing process and increase the wiring margin of the circuit carrier board 1. Furthermore, the build-up layers formed by the dielectric layers 220 of the second substrate 200 may be used to supports the first substrate 100, thereby improving the overall rigidity the reliability of the structure of the circuit carrier board 1.

In short, in the manufacturing method of the circuit carrier board 1 of the present embodiment, since the second substrate 200 having a normal linewidth can be directly formed and bonded to the entire surface of the first substrate 100 having the first circuit layer 110 with the ultra-fine linewidth. Therefore, the first circuit layer 110 and the second circuit layer 120 made of different fineness in linewidth can be directly integrated onto the circuit carrier board 1, which simplifies the process, reduces the cost, and improves the wiring margin. In addition, the electronic elements 300 having high density circuits (including: the first electronic element 310 and the second electronic element 320) can be directly electrically connected to the pads 132 disposed with fine pitch on the first substrate 100. Under the above arrangement, the electronic elements 300 can achieve interconnectivity through the first circuit layer 110. In this way, the circuit carrier board 1 is adapted to interconnect the plurality of the electronic components 300 with high density circuits, thereby reducing signal delay and improving the performance of the circuit carrier board 1. In addition, the second substrate 200 can further support the first substrate 100, thereby improving the overall rigidity and the reliability of the structure of the circuit carrier board 1.

The following embodiments use the same reference numerals and parts in the foregoing embodiments, wherein the same reference numerals are used to refer to the same or similar elements. For the description of the parts omitted from the related art, reference may be made to the foregoing embodiments and is not repeated in the following embodiments.

Figure 3A:
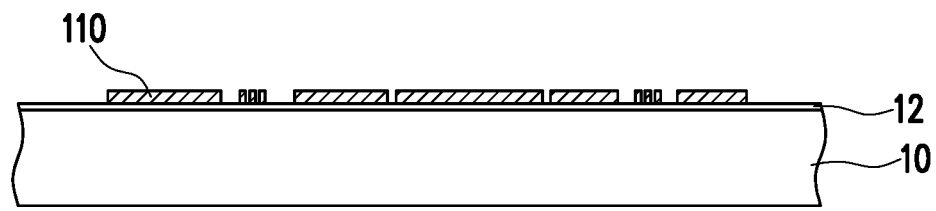
FIG. 3A to FIG. 3K are cross-sectional views showing a manufacturing process of a circuit carrier board of another embodiment of the invention.
Figure 3B:
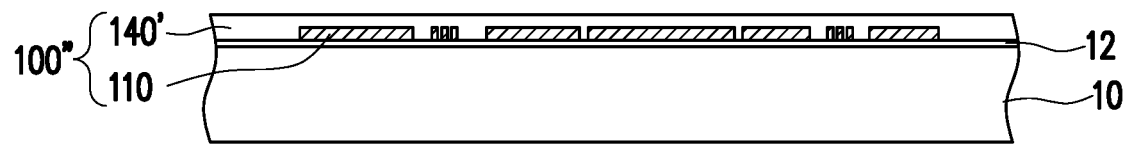
Figure 3C:
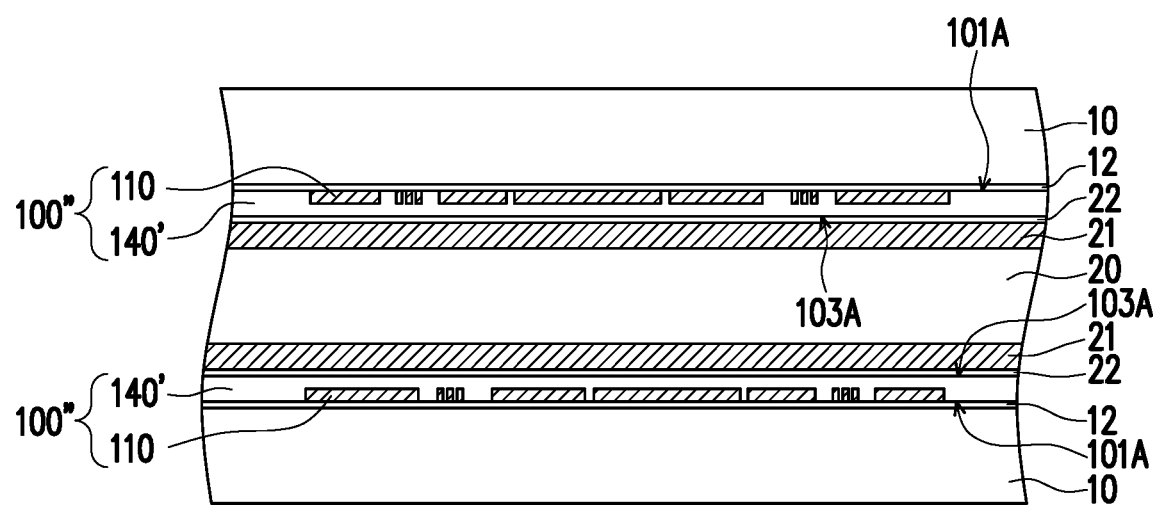
Figure 3D:
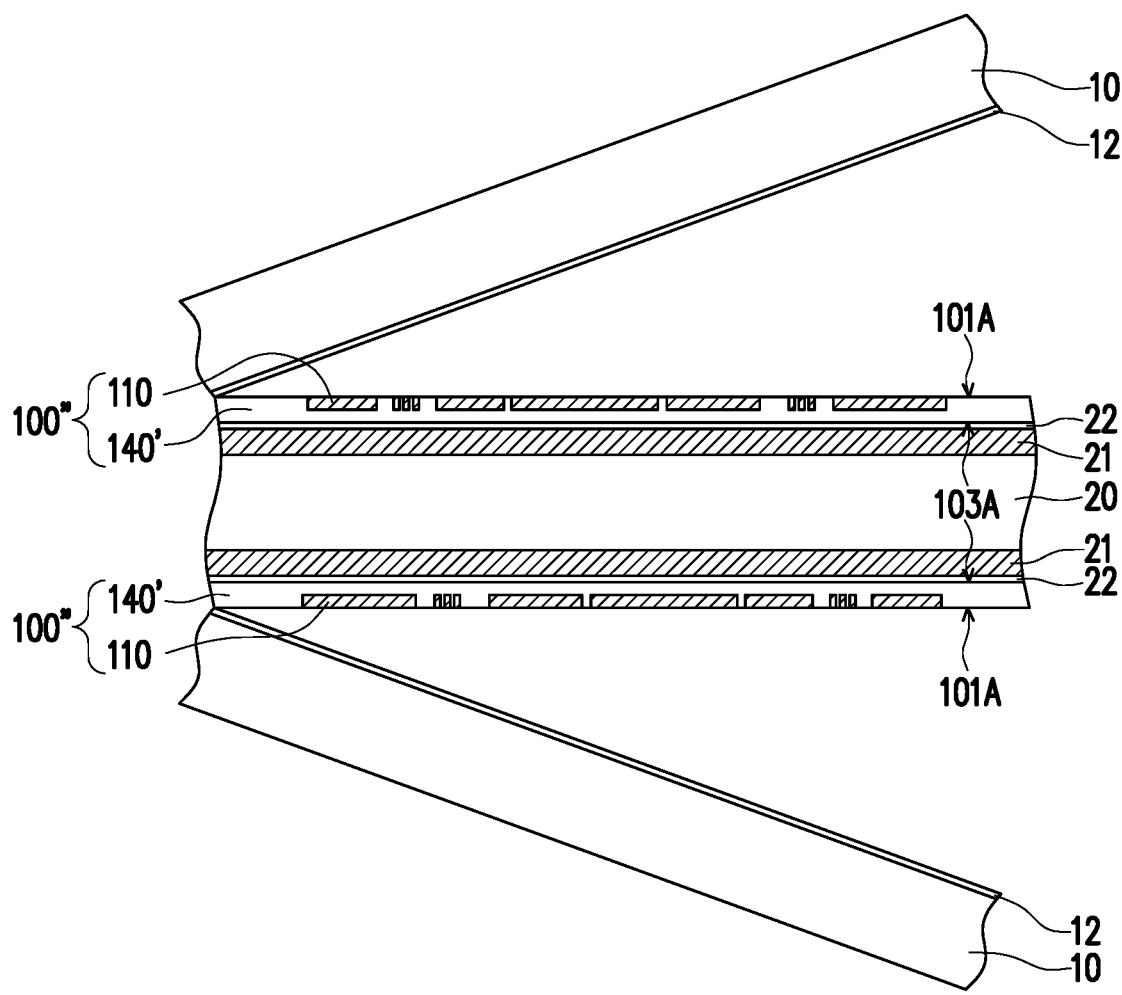
Figure 3E:
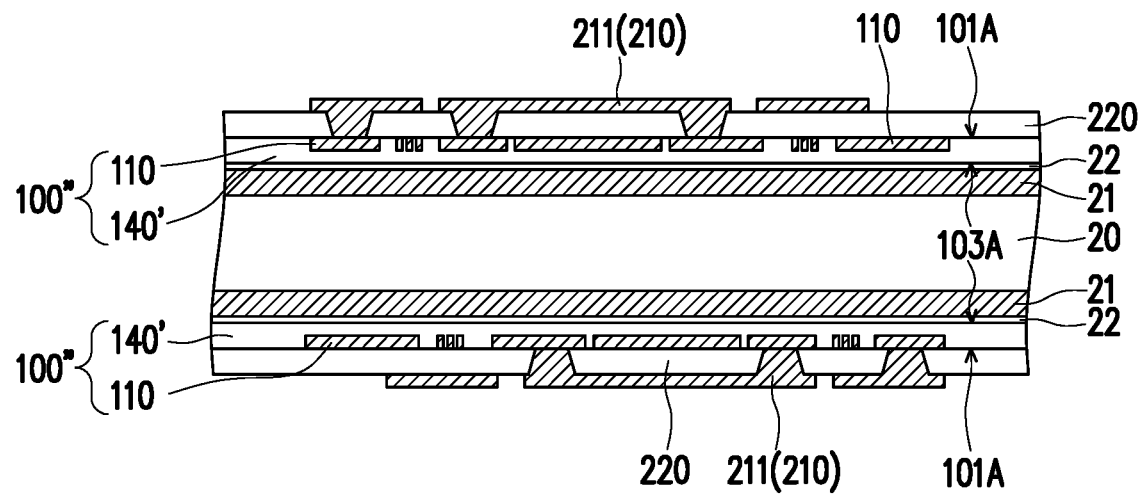
Figure 3F:
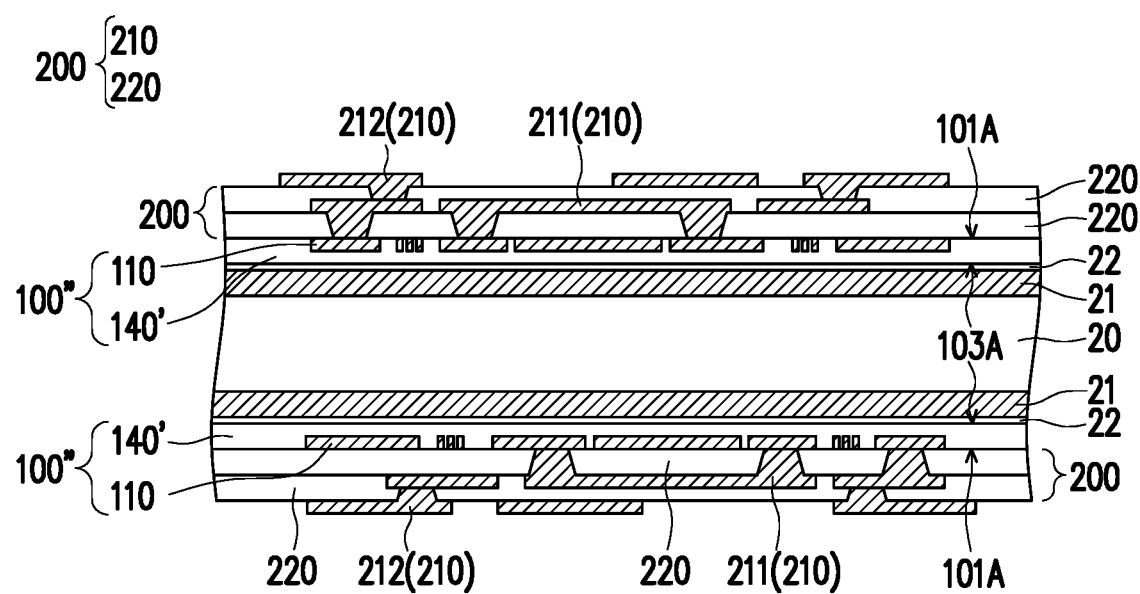
Figure 3G:
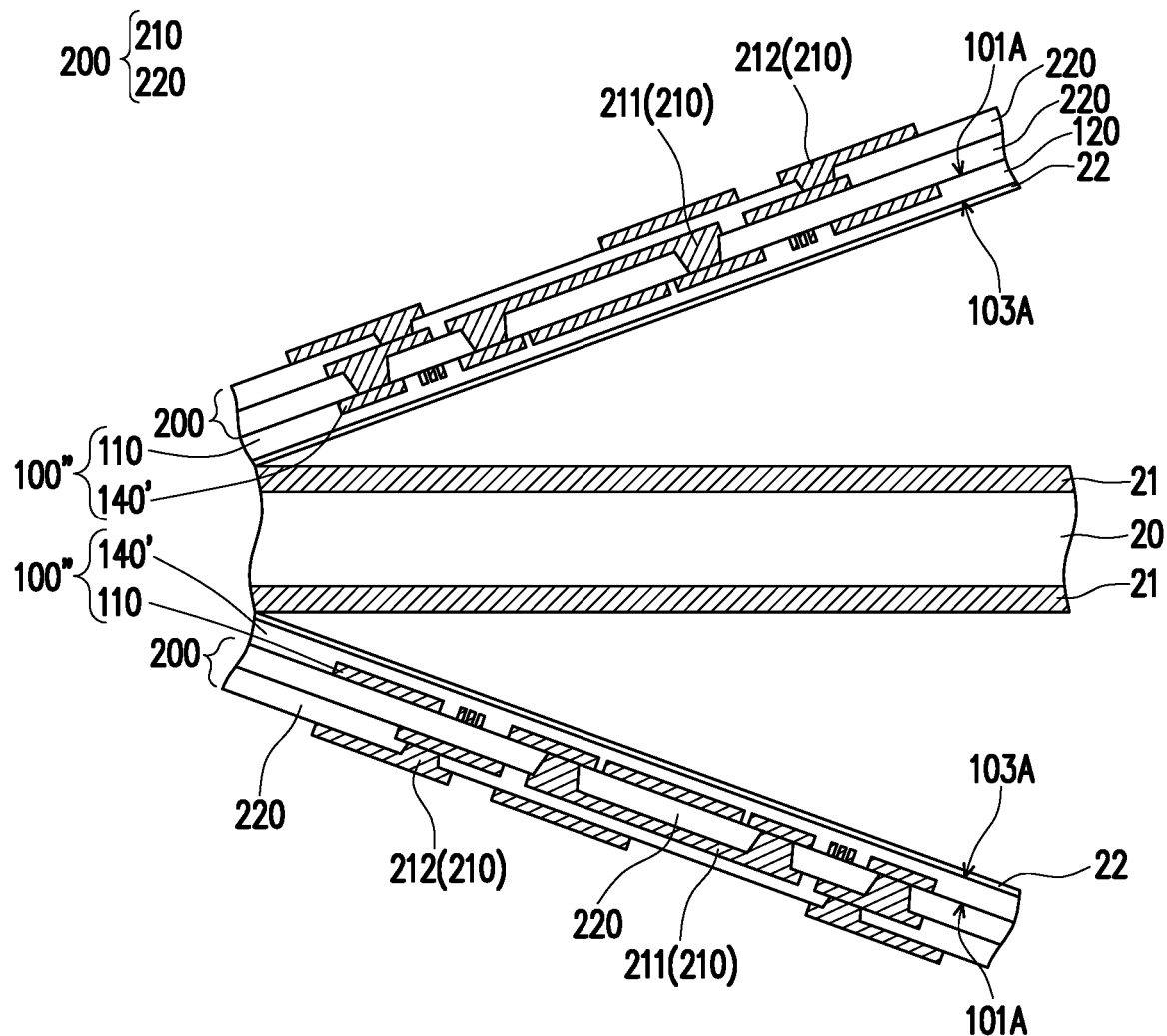
Figure 3H:
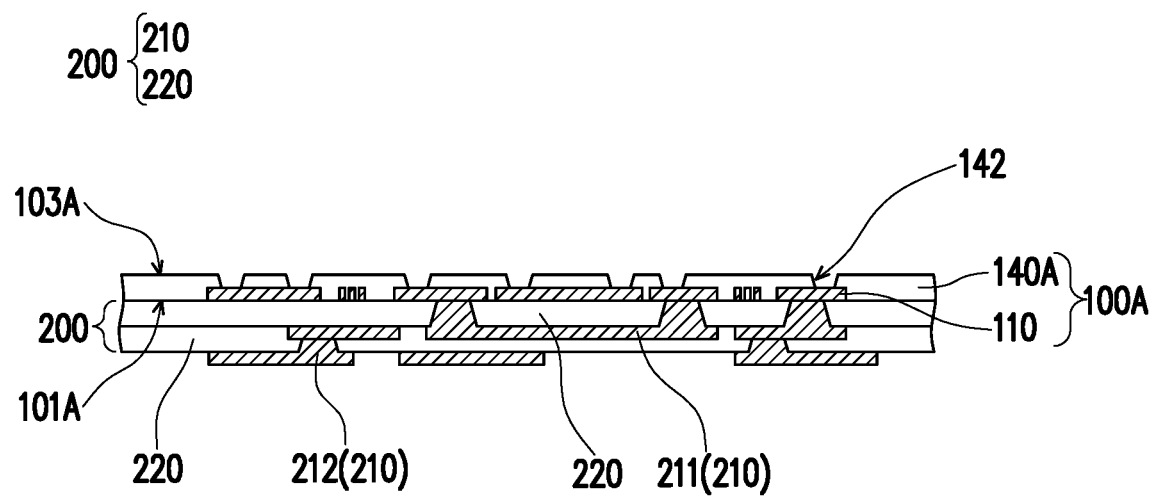
Figure 3I:
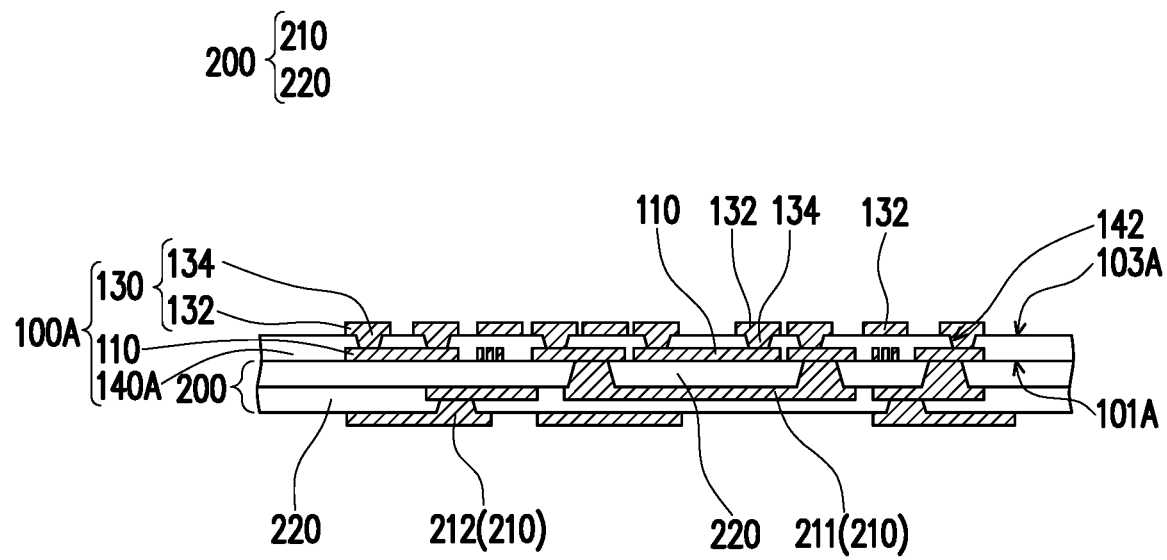
Figure 3J:
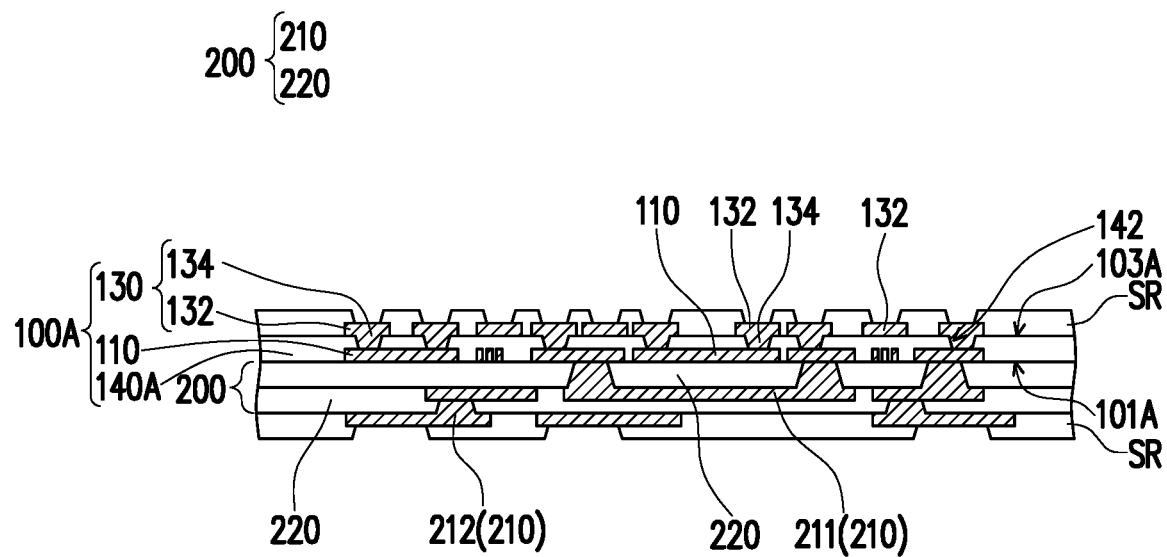
Figure 3K:
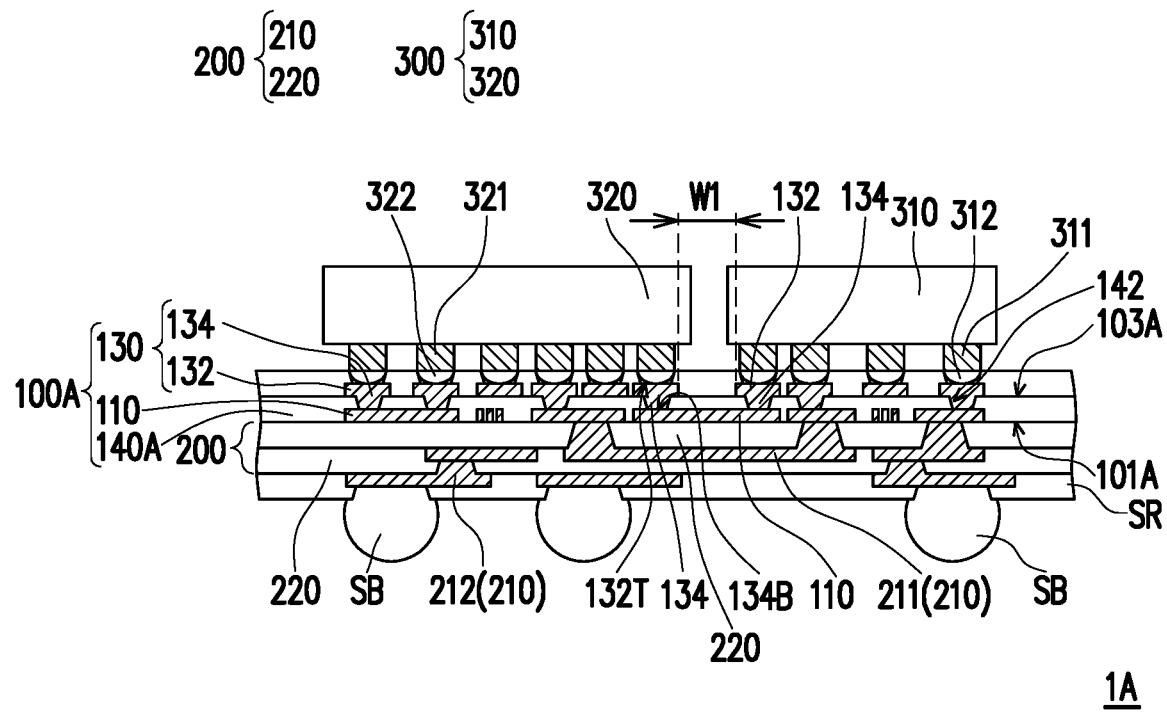

FIG. 3A to FIG. 3K are cross-sectional views showing a manufacturing process of a circuit carrier board according to another embodiment of the invention. Referring to FIG. 1K and FIG. 3K, the circuit carrier board 1A of the present embodiment is similar to the circuit carrier board 1 of FIG. 1K. The main difference is that the circuit carrier board 1A completes the disposition of the second substrate 200 first, and then completes the disposition of the conduction structure 130. Therefore, structural-wise, the first circuit layer 110 can be directly covered by the insulating adhesive layer 140A to form the build-up layer of the first substrate 100A, so as to omit the additional use of the insulating layer 120 (shown in FIG. 1K). A brief description of the manufacturing process of the circuit carrier board 1A will be described in the following. The description of the same or similar components and steps are not repeated.

Referring to FIG. 3A, the first circuit layer 110 is formed on the first temporary carrier board 10.

Referring to FIG. 3B, an insulating adhesive material 140' is formed on the first circuit layer 110 to form a first substrate 100". In other words, the first substrate 100" of the present embodiment includes a build-up layer composed of the first circuit layer 110 and the insulating adhesive material 140', but the invention is not limited thereto. In some embodiments, the first substrate 100" may also include a plurality of build-up layers each formed by the first circuit layer 110 and the insulating adhesive material 140", and stacking the build-up layers in sequence. The first substrate 100" of the present embodiment is, for example, a substrate on which the conductive structures 130 are not yet disposed on the exposed first circuit layer 110. In subsequent steps, the conductive structures 130 are formed on the first substrate 100A (shown in FIG. 3I).

Referring to FIG. 3C and FIG. 3D, the first substrate 100" is disposed on the second temporary carrier board 20. Next, the first temporary carrier board 10 and the release layer 12 on the first temporary carrier board 10 are removed.

Referring to FIG. 3E and FIG. 3F, the second substrate 200 is disposed on the surface 101A of the insulating adhesive material 140' of the first substrate 100". For example, the second substrate 200 includes a plurality of build-up layers (for example, two build-up layers) composed of the dielectric layers 220 and the second circuit layers 210. In detail, after the dielectric layer 220 is disposed on the surface 101A of the insulating material layer 140', the topmost layer 211 of the second circuit layers 210 is formed to be electrically connected to the first circuit layer 110 through the contact windows (not labeled). Then, another dielectric layer 220 is overlaid on the topmost layer 211, and then the bottommost layer 212 of the second circuit layer 210 is formed to be electrically connected to the topmost layer 211 through contact windows (not shown). As shown in FIG. 3E and FIG. 3F, the insulating adhesive material 140' further has another surface 103A opposite to the surface 101A, and the other surface 103A is located between the insulating adhesive material 140' and the second temporary carrier board 20.

Referring to FIG. 3G, the second temporary carrier board 20 is removed, and the step of bonding the second substrate 200 to the first substrate 100" is completed.

Referring to FIG. 3G and FIG. 3H, a plurality of contact windows 142 are formed in the insulating adhesive material 140' to form an insulating adhesive layer 140A.

Referring to FIG. 3I, a plurality of conductive structures 130 are formed in the insulating adhesive layer 140A. At this point, the manufacturing of the first substrate 100A is completed. In the present embodiment, the first substrate 100A includes the first circuit layer 110 embedded in the surface 101A of the insulating adhesive layer 140A and the conductive structures 130 are disposed in the insulating adhesive layer 140A. The pads 132 of the conductive structures 130 are disposed on the other surface 103A. The contact windows 142 of the insulating adhesive layer 140A expose the first circuit layer 110, and the conductive vias 134 of the conductive structures 130 are filled in the contact windows 142 to contact and electrically connect to the first circuit layer 110. In the present embodiment, the method of forming the contact windows 142 includes photolithography, mechanical drilling, laser drilling, or other suitable methods, and the invention is not limited thereto.

Referring to FIG. 3J, a plurality of solder resist layers SR are respectively formed on the first substrate 100A and the second substrate 200. In the present embodiment, the two solder resist layers SR partially cover the conductive structure 130 on the first substrate 100A and the bottommost layer 212 in the second circuit layers 210 on the second substrate 200 respectively.

Referring to FIG. 3K, a plurality of electronic elements 300 are disposed on the first substrate 100 to be electrically connected to the pads 132 and the first circuit layer 110. In the present embodiment, the electronic elements 300 include, for example, the first electronic element 310 and the second electronic element 320, and the conductive bumps 311, 321 are respectively disposed on the first electronic element 310 and the second electronic element 320 in high density. In the present embodiment, the first electronic element 310 and the second electronic element 320 further have solder balls 312, 322 respectively disposed on the conductive bumps 311, 321, but the invention is not limited thereto. The first electronic element 310 and the second electronic element 320 are electrically connected to the pads 132 through the conductive bumps 311, 321 and the solder balls 312, 322.

Finally, a plurality of solder balls SB are disposed on the second substrate 200 and electrically connected to the bottommost layer 212 of the second circuit layers 210. At this point, the manufacturing of the circuit carrier board 1A has been completed. In the above arrangement, since the second substrate 200 can be formed on the insulating adhesive material 140' of the first substrate 100A, and then the disposition the conductive structures 130 is completed. Therefore, the insulating layer 120 can be replaced by the insulating adhesive layer 140A, which may further simplify the manufacturing process, and save cost. In addition, with the above design, the circuit carrier board 1A of the present embodiment can also achieve the same effects as the above embodiment, and thus will not be described herein.

Figure 4:
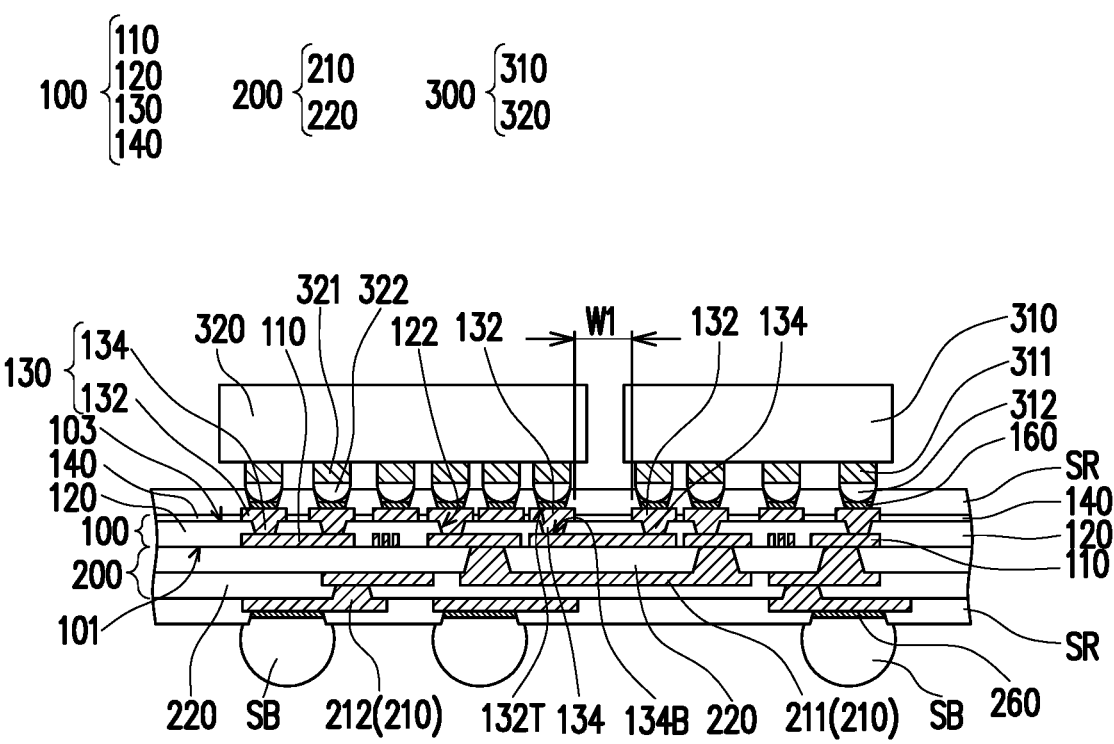
FIG. 4 is a cross-sectional view of a circuit carrier board of yet another embodiment of the invention.

FIG. 4 is a cross-sectional view of a circuit carrier board of yet another embodiment of the invention. Referring to FIG. 1K and FIG. 4, the circuit carrier board 1B of the present embodiment is similar to the circuit carrier board 1 of FIG. 1K. The main difference is that the circuit carrier board 1B further includes a plurality of surface-treated metal pads 160. The metal pads 160, 260 are respectively in contact with and disposed on the pads 132 and the bottommost layer 212 of the second circuit layers 210. From another perspective, the metal pads 160 can be located between the pads 132 and the solder balls 312, 322 of the electronic elements 300 (including the first electronic element 310 and the second electronic element 320). The metal pads 260 may be located between the bottommost layer 212 of the second circuit layers 210 and the solder balls SB.

In the present embodiment, the method for forming the metal pads 160, 260 includes surface treatment of the pads 132 and the bottommost layer 212 of the second circuit layers 210. The surface treatment includes electroless nickel/electroless palladium/immersion gold (ENEPIG), electroless nickel autocatalytic gold (ENAG), Immersion tin (IT), micro-ball, and 305 tin-silver-copper paste (SAC 305). In the above arrangement, the metal pads 160, 260 can protect the pads 132 and the second circuit layer 210, and can also improve the conductivity of the pads 132 and the second circuit layer 210, thereby further improving the overall performance of the circuit carrier board 1B. In addition, with the above design, the circuit carrier board 1B of the present embodiment can also achieve the same effects as the above embodiment, and thus will not be described herein.

In summary, in the circuit carrier board and the manufacturing method thereof according to an embodiment of the present invention, since the second substrate having a normal linewidth can be directly formed and bonded to the entire surface of the first substrate having the first circuit layer with the ultra-fine linewidth. Therefore, the first circuit layer and the second circuit layer made of different fineness in linewidth can be directly integrated onto the circuit carrier board, which simplifies the manufacturing process, reduces the cost, and improves the wiring margin. In addition, the electronic elements having high density circuits (including: the first electronic element and the second electronic element) can be directly electrically connected to the pads disposed with fine pitch on the first substrate 100. Under the above arrangement, the electronic elements can achieve interconnectivity through the first circuit layer. In this way, the circuit carrier board is adapted to interconnect the plurality of the electronic components with high density circuits, thereby reducing signal delay and improving the performance of the circuit carrier board. In addition, the build-up layers of the second substrate can further support the first substrate, thereby improving the overall rigidity and the reliability of the structure of the circuit carrier board.

In addition, the circuit carrier board can also partially expose the pads through the insulating adhesive layer to increase the structural reliability of the pad, and further protect the pads and the insulating layer. Furthermore, the insulating adhesive layer may have the effect of solder resist, thus allowing to omit the step of disposing the solder resist layer, and simplify the manufacturing process and save costs.

In addition, the manufacturing method of the circuit carrier board can also complete the disposition of the second substrate first, and then complete the disposition of the conductive structures on the first substrate. Therefore, the first circuit layer can be directly covered by the insulating adhesive layer, thereby replacing the insulating layer and further simplifying the manufacturing process and saving cost.

Furthermore, the circuit carrier board may further include metal pads disposed on the pads and the bottommost layer of the second circuit layers. Therefore, the metal pads can protect the pads and the second circuit layer, and can also improve the conductivity of the pads and the second circuit layer, thereby further improving the overall performance of the circuit carrier board.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit carrier board comprising:
   a first substrate, comprising a first circuit layer and a plurality of conductive structures electrically connected to the first circuit layer, wherein the conductive structures being adapted to be electrically connected to the plurality of electronic elements; and
   a second substrate is bonded to the first substrate and contacts the first circuit layer, wherein the second substrate comprising:
      a plurality of dielectric layers stacked on the first substrate in sequence; and
      a plurality of second circuit layers are disposed in the dielectric layers, wherein a bottommost layer of the second circuit layers is exposed outside of the dielectric layers, and a topmost layer of the second circuit layers is electrically connected to the first circuit layer,
   wherein, the conductive structures comprises a plurality of pads and a plurality of conductive vias, and the pads are electrically connected to the first circuit layer through the conductive vias,
   wherein an orthographic projection of a bottom surface of each of the conductive vias contacting the first circuit layer on the second substrate is located within an orthographic projection of a top surface of each of the pads on the second substrate,
   wherein a linewidth of the first circuit layer is smaller than a linewidth of the second circuit layer.

2. The circuit carrier board according to claim 1, wherein the first substrate further comprises:
   an insulating layer, wherein the first circuit layer is embedded in a surface of the insulating layer; and
   an insulating adhesive layer is disposed on the other surface of the insulating layer opposite to the surface,
   wherein, the conductive structures are disposed in the insulating layer, and portions of each of the pads are disposed on the other surface, and the insulating adhesive layer surrounds each of the pads.

3. The circuit carrier board according to claim 2, wherein a material of the insulating layer is selected from the group consisting of an Ajinomoto build-up (ABF) film, an adhesive or a photosensitive dielectric material.

4. The circuit carrier board according to claim 2, wherein a material of the insulating adhesive layer is selected from the group consisting of a thermosetting polymer or a photopolymer.

5. The circuit carrier board according to claim 1, wherein the first substrate further comprises:
   an insulating adhesive layer, wherein the first circuit layer is embedded in a surface of the insulating adhesive layer, and the insulating adhesive layer has a plurality of contact windows,
   wherein, the conductive structures are disposed in the insulating adhesive layer, and the portions of the pads are disposed on the other surface opposite to the surface, and the conductive vias are respectively filled in the contact windows to contact the first circuit layer.

6. The circuit carrier board according to claim 1, further comprising:
   a plurality of solder resist layers respectively disposed on the first substrate and the second substrate, wherein the solder resist layers partially covered the conductive structures and the bottommost layer of the second circuit layers; and
   a plurality of solder balls disposed on the second substrate and electrically connected to the bottommost layer of the second circuit layers.

7. The circuit carrier board according to claim 1, wherein a spacing between any two of the adjacent pads is between a range of 10 microns to 60 microns.

8. The circuit carrier board according to claim 1, wherein the linewidth of the first circuit layer is between a range of 1 micron to 5 microns.

9. The circuit carrier board according to claim 1, wherein the linewidth of the first circuit layer is less than or equal to a diameter of the bottom surface of each of the conductive vias.

10. The circuit carrier board according to claim 1, wherein the pads are adapted to be electrically connected to the electronic elements.

11. The circuit carrier board according to claim 1, further comprising a plurality of surface-treated metal pads, wherein the metal pads are respectively in contact with and disposed on the pads and the bottommost layer of the second circuit layers.

* * * * *